US012784216B2

(12) United States Patent
Lebel

(10) Patent No.: US 12,784,216 B2
(45) Date of Patent: Nov. 3, 2026

(54) DEEP LEARNING BASED MEDICAL IMAGING SYSTEM AND METHOD

(71) Applicant: GE Precision Healthcare LLC, Wauwatosa, WI (US)

(72) Inventor: Robert Marc Lebel, Calgary (CA)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 597 days.

(21) Appl. No.: 18/316,666

(22) Filed: May 12, 2023

(65) Prior Publication Data

US 2024/0378726 A1 Nov. 14, 2024

(51) Int. Cl.
*G06T 7/00* (2017.01)
*G01R 33/56* (2006.01)

(52) U.S. Cl.
CPC ........ *G06T 7/0014* (2013.01); *G01R 33/5608* (2013.01); *G06T 2207/10088* (2013.01); *G06T 2207/20081* (2013.01); *G06T 2207/20084* (2013.01); *G06T 2207/30016* (2013.01)

(58) Field of Classification Search
CPC ......... G06T 7/0014; G06T 2207/10088; G06T 2207/20081; G06T 2207/20084; G06T 2207/30016; G06T 5/60; G06T 5/70; G06T 11/005; G01R 33/5608; A61B 5/055; G06N 3/04; G06N 3/08
See application file for complete search history.

(56) References Cited

U.S. PATENT DOCUMENTS

2022/0107378 A1* 4/2022 Dey ......................... G06N 3/09
2022/0180242 A1* 6/2022 Lee ......................... G06N 3/047
2023/0325982 A1* 10/2023 Kapoor ..................... G06N 3/08 382/104
2023/0376837 A1* 11/2023 Gerdes ..................... G06N 20/00
2024/0104698 A1* 3/2024 Nie ......................... G06N 3/044
2024/0232696 A1* 7/2024 Dervovic ............... G06N 20/00

OTHER PUBLICATIONS

Aggarwal et al., "MoDL: Model-based deep learning architecture for inverse problems", IEEE transactions on medical maging. Aug. 13, 2018;38(2):394-405, 12 pages.
Hammernik et al, "Learning a variational network for reconstruction of accelerated MRI data", Magn Reson Med. Jun. 2018;79(6):3055-3071, 29 pages.
Lauer et al, "Assessment of resolution and noise in MR images reconstructed by data driven approaches," ISMRM 2022. 0303, 2 pages.
Malkiel et al, "Densely Connected Iterative Network for Sparse MRI Reconstruction", ISMRM 2018. 3363, 2 pages.
Robson et al, "Comprehensive quantification of signal-to-noise ratio and g-factor for image-based and k-space-based parallel imaging reconstructions", Magn Reson Med. Oct. 2008;60(4):895-907, 13 pages.

* cited by examiner

*Primary Examiner* — Iriana Cruz
(74) *Attorney, Agent, or Firm* — Fletcher Yoder, P.C.

(57) ABSTRACT

A medical imaging system includes at least one medical imaging device to provide image data of a subject. A processing system is programmed to train a deep learning (DL) network using input image training data. The input image training data includes raw image data and at least one perturbation signal. The trained DL network is used to determine reconstructed image data from the image data of the subject and based on the reconstructed image data, a medical image of the subject is generated.

22 Claims, 6 Drawing Sheets

DEEP LEARNING BASED MEDICAL IMAGING SYSTEM AND METHOD

BACKGROUND

Embodiments disclosed in the present invention relate to medical devices, and more specifically to deep learning (DL) based medical imaging system and method.

Currently, medical imaging devices are increasingly widely used to scan a subject under test (such as the human body) to obtain a medical image of a specified part (such as the whole or a part of each organ in the body, or a specific region of interest) so as to provide useful information for medical diagnosis. Medical image scanning includes magnetic resonance imaging (MRI), X-ray imaging, computed tomography (CT) imaging, ultrasound imaging etc.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

Similar to other technology domains, deep learning (DL) has made a significant foray into the MRI domain as well. Specifically, DL assisted image reconstructions are becoming state-of-the art, producing better image quality and/or enabling higher acceleration rates than achievable with conventional methods. DL networks are used to mitigate noise amplification while retaining important signal characteristics. However, conventional loss functions used in DL networks produce object-dependent noise alterations and non-uniform point-spread functions.

Therefore, there is a need for an improved method for training DL networks for the medical imaging system and method.

BRIEF DESCRIPTION

In accordance with an embodiment of the present technique, a medical imaging system is provided. The medical imaging system includes at least one medical imaging device providing image data of a subject and a processing system. The processing system is programmed to train a deep learning (DL) network using input image training data, wherein the input image training data includes raw image data and at least one perturbation signal. The processing system is further programmed to use the trained DL network to determine reconstructed image data from the image data of the subject and generate a medical image of the subject based on the reconstructed image data.

In accordance with another embodiment of the present technique, a method for imaging a subject is provided. The method includes training a deep learning (DL) network using input image training data, wherein the input training data includes raw image data and at least one perturbation signal. The method further includes acquiring image data of the subject with a medical imaging device and providing the image data of the subject as an input to the trained DL network. The method also includes using the DL network to generate a medical image of the subject based on the acquired image data.

In accordance with yet another embodiment of the present technique, a method for generating an image of an object with a magnetic resonance imaging system is provided. The method includes training a deep learning (DL) network using magnetic resonance (MR) image training data, wherein the MR image training data includes raw image data and at least one perturbation signal. The method further includes acquiring MR image data of the object with the MRI system and providing the MR image data of the subject as an input to the trained DL network. Moreover, the method includes using the DL network to generate the image of the object based on the acquired MR image data.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

Although, the system and method presented herein is explained with respect to the magnetic resonance imaging (MRI), the technique can also be equally applied to other medical imaging modalities, including, but not limited to, a computed tomography (CT) device, an X-ray imaging device, a positron emission computed tomography (PET) device, a single photon emission computed tomography (SPECT) device, an ultrasound device or any other suitable medical imaging device.

Figure 1:
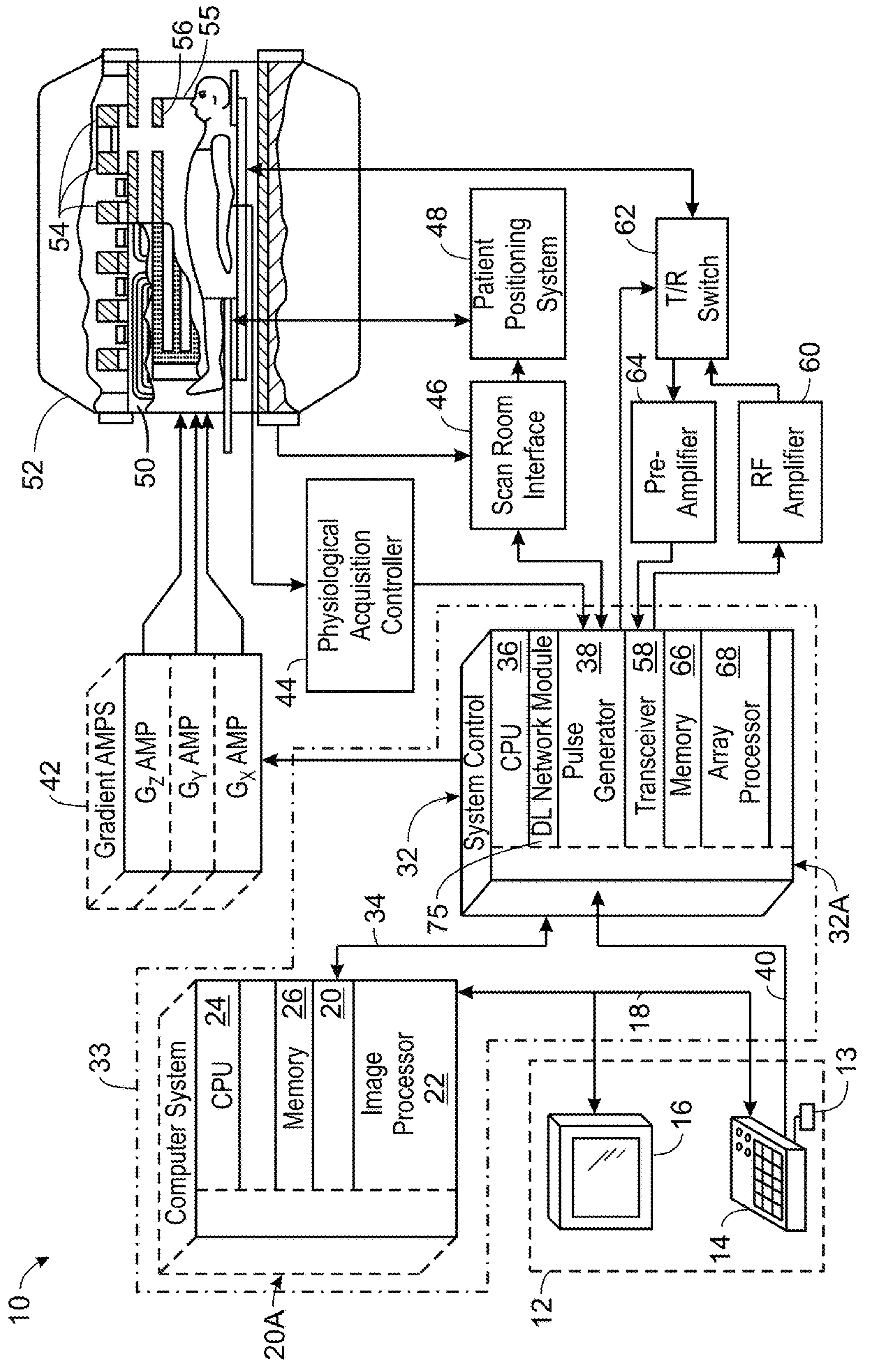
FIG. 1 is a schematic diagram of an exemplary magnetic resonance imaging (MRI) system, in accordance with an embodiment of the present technique.

Embodiments of the present technique will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20*a*. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32*a*. These modules include a CPU module 36, a deep learning (DL) network or module 75 as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the subject, such as ECG signals received from electrodes attached to the patient. As used herein, a subject is a human (or patient), an animal, or a phantom. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy. Typical surface coil would have eight receiving channels; however, different number of channels are possible. Using the combination of both a body coil 56 and a surface coil is known to provide better image quality.

The MR signals produced from excitation of the target are digitized by the transceiver module 58. The MR system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform or a deep learning algorithm. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. In one embodiment, the DL module 75 may be used to reconstruct the MR images. In general, complex MR images are MR images with each pixel represented by a complex number, which also has a real component and an imaginary component. The magnitude M of the received MR signal may be determined as the square root of the sum of the squares of the I and Q quadrature components of the received MR signal as in equation 3 below:

$$M = \sqrt{I^2 + Q^2} \quad (1)$$

and the phase ϕ of the received MR signal may also be determined as in equation 2 below:

$$\phi = \tan^{-1}\left(\frac{Q}{I}\right) \quad (2)$$

The acquired MR data from the image processor 22 may include artifacts due to subject motion or due to pathology condition of the subject such as metal implants or fractures in a human body. In one embodiment of the present technique, the DL network module 75 removes these artifacts without affecting the MR image features. The DL network module 75 may also be used to improve the signal to noise ratio (SNR) and sharpness in the image data. In general, the DL module 75 provides high-fidelity images that maximize feature preservation. In one embodiment, the DL module 75 is trained using perturbed training input data, wherein the output of the DL module is reconstructed data of the perturbed training input data. The details of which will be explained in subsequent paragraph.

Figure 2A:
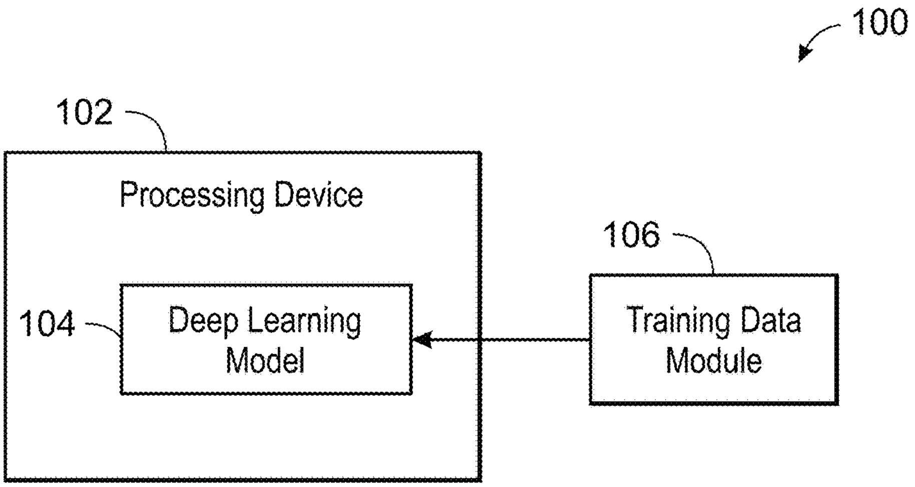
FIG. 2A is an exemplary medical image processing system, in accordance with an embodiment of the present technique.

FIG. 2A is a schematic diagram of an exemplary medical image processing system 100 which is used in MRI system 10 of FIG. 1. In the exemplary embodiment, the system 100 includes a processing device 102 which is configured to provide high-fidelity images, reduce artifacts in medical images and/or to improve SNR and sharpness. The processing device 102 includes a DL network model 104. In one embodiment, the processing device 102 may include an image reconstruction module (not shown) that may work in conjunction with the DL network model 104 to reconstruct the medical image with a better quality compared to the original image data of the subject.

The system 100 also includes a training data module 106 to provide training data in accordance with an embodiment of the present technique. The training data from the training data module 106 is used to train the DL network model 104. The processing device 102 may then use the trained DL network model 104 to generate the high-fidelity image. In one embodiment, the high-fidelity image may be defined as the image with optimized point spread function (PSF) i.e., an image in which blurring has been minimized and sharpness has been improved compared to the original image.

The processing device 102 may be included in the workstation 12 of the MRI system 10, or may be included on a separate computing device that is in communication with the workstation 12. Further, in another embodiment, training data module 106 may be included on a separate computing device and may provide the training data well ahead of the actual operation of the MRI system 10. The training data may include the medical images themselves or a transformed version such as Fourier (i.e., k-space) or radon transform data. Further, the training data may include input image training data. In one embodiment, the input image training data may be raw data or k-space data along with a perturbation signal and the output of the DL network may be reconstructed medical image or some sort of reconstructed medical image data of the input image training data. In another embodiment, the input image training data may be the image itself with some artifacts or noise. In yet another embodiment, the output of DL network 104 may just be some reconstructed k-space data that is converted into the high-fidelity image by a separate reconstruction module by means of a Fourier transform, for example. In one embodiment, the input image training data may include perturbed input image training data which may be some combination of the raw data, random noise and at least one perturbation signal. The details of which will be explained in subsequent paragraphs.

Figure 2B:
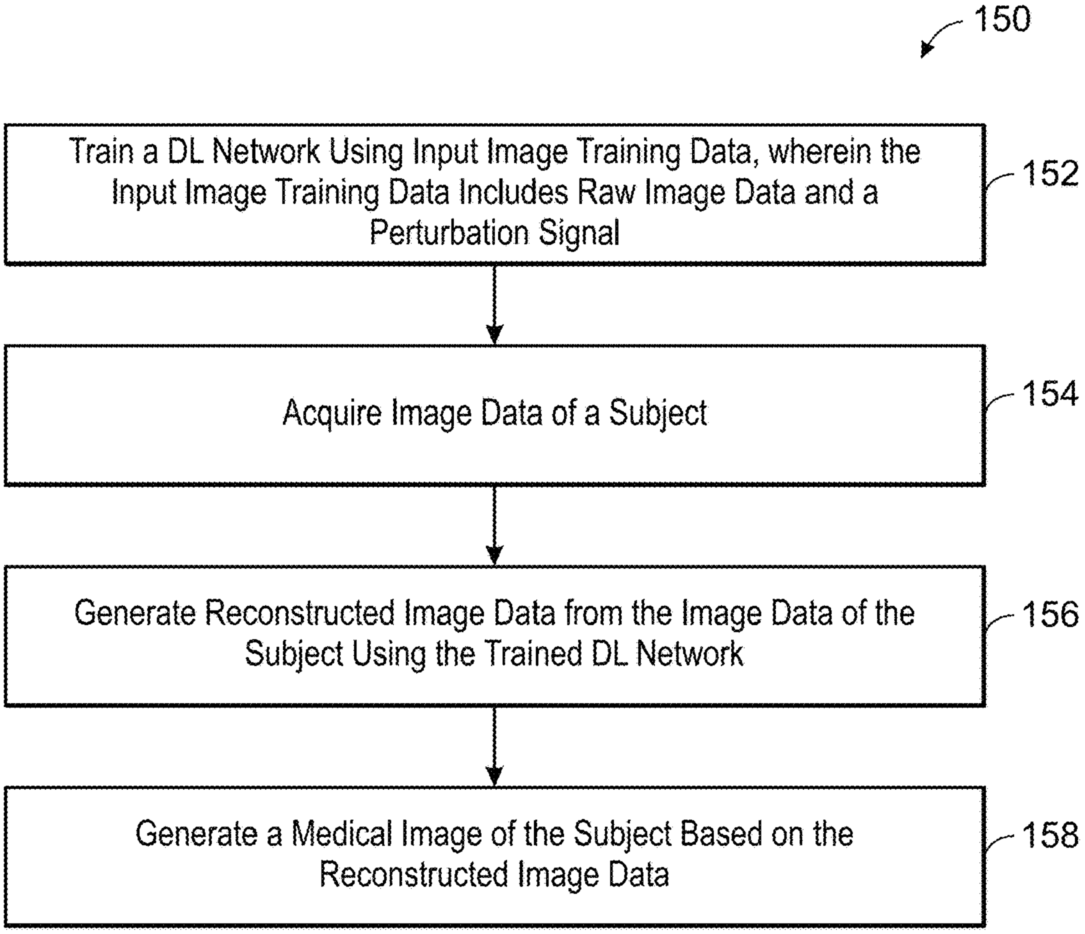
FIG. 2B is a flow chart of an exemplary method that may be implemented in system of FIG. 2A in accordance with an embodiment of the present technique.

FIG. 2B is a flow chart of an exemplary method 150. The method 150 may be implemented on the medical image processing system 100. However, the method may also be used with other medical imaging systems such as an X-ray imaging system, a computed tomography (CT) imaging system, or an ultrasound imaging system. In the exemplary embodiment, the method includes training a DL network using input image training data at step 152. The input image training data may be under-sampled image training data of a plurality of patients stored historically. In one embodiment, the under-sampled image training data may be obtained based on the fully sampled image data itself.

In one embodiment, the training of the DL network is unsupervised training i.e., no fully sampled ground truth images are needed to train the DL network. The input image training data includes raw image data and at least one perturbation signal. In an embodiment, the input image training data may include raw image data with a plurality of perturbation signals. In one embodiment, the raw image data is a low resolution or under-sampled image data of a plurality of patients stored historically. Further, the raw image data may be k-space data or the medical image itself. In one embodiment, the perturbation signal may be synthetically generated. In another embodiment, the perturbation signal is a very small amplitude signal relative to the raw image data but sufficiently large such that it is detectable. For example, the perturbation signal may be a very sparse image of a single point (single pixel). Therefore, the perturbation signal does not alter the final image appearance substantially. In one embodiment, the perturbation signal is converted into the same format as the raw image data i.e., either k-space data or image itself. Moreover, it should be noted that the perturbation signal may not be a noise signal like a Gaussian noise as the purpose of training the DL network using the perturbation signal is to retain image details or to maximize feature preservation even in presence of the noise in the image. In fact, in an embodiment, the noise signal is separately added into the raw image data and the perturbation signal for training the DL network so that even in the presence of the noise, the DL network should be able to provide clear image details. The details of this training procedure are described with respect to FIG. 3.

In general, the purpose of the fully trained DL network is to provide high-fidelity image data (i.e., a high sharpness to noise ratio) based on the input image data (i.e., an input signal to the DL network). In one embodiment, during the training procedure, the DL network reconstructs the input image data a plurality of times: once normally with or without the addition of some noise to the raw image data and at least one another time with the addition of a small perturbation to the raw image data. Because the DL network needs to reconstruct the input training image data a plurality of times, multiple copies of the same DL network (i.e., a plurality of DL networks having same parameters) may be used in the implementation. For example, if 3 perturbation signals are being used to train the DL network then 4 DL networks (4 copies of the same DL network) may be used in one embodiment. In this embodiment, one DL network may reconstruct the raw image data with or without the addition of some noise and other three DL networks may reconstruct the raw image data with the addition of one of the three different perturbation signals used. The parameters of the DL network (e.g., weights and offsets for different layers of the DL network) are then modified based on a loss function. The loss function is used to minimize the difference or error between the plurality of DL network outputs i.e., reconstructed images or k-space data thereof generated by the plurality of DL networks.

For an MRI system, the MR image reconstruction problem may be defined as in equation 3 below:

$$Ax = b \tag{3}$$

where x is the desired MR image, b is the acquired MR k-space data or raw image data, and A is the combination of MR system coils sensitivities (known in advance), Fourier operator, and sampling mask (known in advance). Matrix A is then inversed and multiplied by b to obtain x or the desired image. However, the inversion of matrix A is ill-conditioned. Therefore, it is common to regularize the solution by adding some additional constraints as in equation 4

$$\text{minimize } \|D(x)\|^2 \quad \text{s.t. } \|Ax - b\|^2 < \epsilon \tag{4}$$

where $\in$ is a data consistency threshold determined based on the noise level of the data. These coupled equations in the above equation can be solved with direct inversion or iterative methods to recover the image or a solution x that is consistent with the known data but satisfies some expectations of a desirable image (the D operator). In one embodiment, deep learning networks can be used as the D operator or to solve Eq 4 directly to generate the image data x based on the raw image data b.

The entire reconstruction process, including DL networks, used to solve Eq 4 can be represented as the operator or function R that accepts the raw image data (and possibly auxiliary information like the coil sensitivities) and returns the estimated image data ($x_e$):

$$R(b) = x_e \tag{5}$$

Typically, the estimated image data $x_e$ is compared to a ground truth version of the image data $x_g$ via a loss function (L) that promotes similarity, yielding a scalar loss value (l):

$$l = L(x_e\ x_g) \tag{6}$$

As will be appreciated by those skilled in the art, the loss function L may be a L2-norms (sum squared error) function or a structural similarity (SSIM) function. The weights of the DL network R are adjusted via gradient backpropagation to minimize the loss l.

In the proposed DL network training suggested in step 252, a low amplitude image perturbation signal (p) and random noise (σ) is added to the input data b (i.e., a small perturbation overlaid on the under-sampled raw image data), yielding an estimated image ($x_e'$):

$$R(b + Ap + \sigma) = x_e' \tag{7}$$

This leads to a new loss function $$l = L(x_e' - x_e,\ p) \tag{8}$$

This loss function requires that the difference (referred to as at least one restored perturbation signal) between the data of two reconstructed images i.e., a first reconstructed image without perturbation $x_e$ and a second reconstructed image with perturbation $x_e'$ should equal the originally added perturbation signal p. In one embodiment, the first reconstructed image and the second reconstructed image are part of a plurality of reconstructed images. The loss function may be a L2-norms (sum squared error) function or a structural similarity (SSIM) function. It should be noted that the function R in equation (5) and equation (7) are the same. The only thing that is different in equations (5) and (7) is the input data that the function R operates on i.e., b+Ap+σ in equation (7) instead of b as in equation (5).

It should also be noted that instead of adding the random noise (σ) with the perturbation p in equation 7, in another embodiment, the random noise (σ) may be added to the raw image data b in equation 5 or to both the equations 5 and 7. Moreover, as discussed earlier, in one embodiment, a plurality of DL networks with same parameters may be used to reconstruct the data. In such embodiments, it is possible to use a plurality of perturbation signals and add them to the raw image data b while executing the DL networks. In other words, the plurality of reconstructed images is generated by executing the DL network a plurality of times with the raw image data, noise data, a plurality of perturbation signals or various combinations thereof. Thus, in one embodiment, a plurality of equations like equation (7) may be used and the loss l then would be the difference of the perturbations as in equation below:

$$l = L(x_{e1}' - x_{e2}',\ p_1 - p_2) \tag{9}$$

where $p_1$ and $p_2$ are two different perturbations and $x_{e1}'$ and $x_{e2}'$ are estimated images by the two DL networks (having same parameters) with two perturbations $p_1$ and $p_2$ as inputs respectively along with the raw image data.

Further, it should be noted that the DL networks presented here are non-linear and object dependent. For these DL networks to work, raw image data b is needed. If these DL networks are trained only on the perturbation signal without any raw image data (i.e., evaluating R(Ap)=$p_e$ and directly minimizing the distance between p and $p_e$) then the DL networks will optimally reconstruct the perturbation but will not generalize well to image reconstruction. Therefore, the DL network should be trained on raw image data with small perturbation but not on the perturbation signal itself. Further, the perturbation should be very small relative to the raw image data. In general, the perturbation should hide in the image, using it as a carrier signal during the reconstruction process.

By training the DL network to identify the perturbation in the image data, the trained DL network can identify image features with high precision. Moreover, in one embodiment, while training the DL network some noise data may be added to the image data so that even in presence of the noise, the DL network should be able to identify the perturbation. The details of this training procedure are described with respect to FIG. 3.

It should be noted that in the present technique, the input image training data with the perturbation signal and corresponding output image training data is used for only training the DL network. After the training, once the DL network deployed in the system and used on the actual subject data, no perturbation signal is used. Thus, after the actual deployment of the DL network, the DL network only operates to reconstruct the actual MR image based on the acquired MR data fed to the DL network. Therefore, a plurality of DL networks having same parameters may be needed only for the training purpose but during the deployment into the live system only one DL network may be sufficient.

Referring back to FIG. 2B, actual image data of a subject is acquired in step 154. The image data may be MR data, CT data ultrasound data or X-ray data depending on the medical imaging system. Moreover, the image data may be for a particular organ or body part of the subject such as brain, knee, shoulder etc. The acquired image data of the subject is then fed to the DL network that was trained in step 152. At step 156, the method includes generating the reconstructed image data from the acquired image data by executing the trained DL network. Finally, at step 158, a medical image of the subject is generated based on the reconstructed image data. The reconstructed image data may be reconstructed k-space data having optimized feature retention. It should be noted that if the DL network itself is trained to generate the medical image of the subject based on the input data then the step 158 is redundant i.e., step 158 is optional depending on nature of the DL network.

Figure 3:
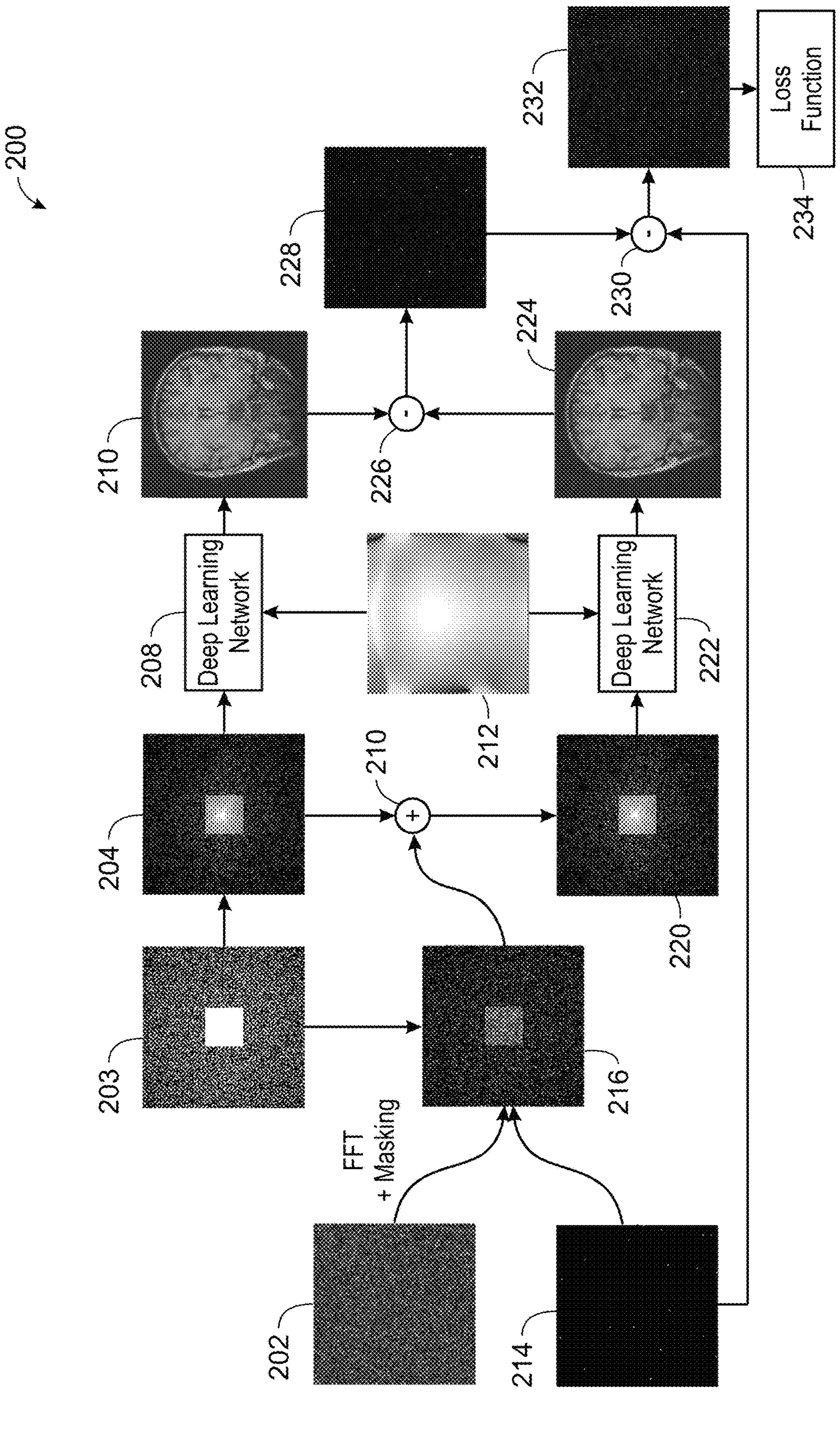
FIG. 3 is a schematic diagram depicting training of a deep learning (DL) network in accordance with an embodiment of the present technique.

FIG. 3 is a block diagram 200 explaining the training of the DL network in accordance with an embodiment of the present technique. In FIG. 3, a sampling mask 203 is applied to a training image data to generate raw image data 204. In the embodiment shown, raw image data 204 is the under-sampled k-space data of a patient. The raw image data 204 is fed as an input signal to a DL network 208. The output of DL network 208 then produces first reconstructed image 210. In one embodiment, the DL network also receives sensitivity maps 212 as an input for producing the first reconstructed image 210. In general, the DL network represents function R of equation 5 and converts the raw image k-space data 204 into the first reconstructed image 210.

Further, a perturbation signal 214 is also shown in FIG. 3. As described earlier, while training the DL network some noise data may be added to the image data so that even in presence of the noise, the DL network should be able to identify the perturbation or image features. Thus, FIG. 3 shows a noise signal 202. The noise signal image 202 shown is a gaussian noise image but other noise signals may be used. The perturbation signal image 214 and the noise signal image 202 are combined and converted in the same format as raw image data 204 with the same sampling mask 203. The resultant image data 216 (referred to as perturbation image data) is thus, a k-space data of the sampled perturbation signal with the gaussian noise. It should be noted that if the raw image data 204 is an image instead of k-space data, then noise signal and the perturbation signal may not need to be converted into k-space data.

The perturbation image data 216 is then added to the raw image data 204 using a summation block 210. The output of the summation block 210 is referred to as perturbed input training data 220. The perturbed input training data 220 is fed to the DL network 222 as an input signal. It should be noted that both the top and bottom DL networks 208 and 222 are exactly the same and represent the function R of equations 5 and 7 respectively. Therefore, the same sensitivity maps 212 are also provided to DL network 222. In one embodiment, the same network 208 can be used twice (instead of using the two DL networks 208 and 222 separately) e.g., first without the perturbed input training data (output of summation block 206) and then second time with the perturbed input training data 220.

The output of the DL network 222 is second reconstructed image 224. A subtraction block 226 subtracts the second reconstructed image 224 from the first reconstructed image 210. This subtraction results in a restored perturbation signal 228. The DL network 222 is trained to produce the restored perturbation signal 228 that is similar to the perturbation signal 214. Therefore, a subtraction block 230 is used to subtract the restored perturbation signal 228 from the perturbation signal 214 to generate a loss image 232 (also referred to as a loss metric). A loss function then operates on the loss metric 232 to minimize the loss and based on the loss function, the parameters of the DL network 222 such as “weight” or “bias” are adjusted. As described earlier, since DL networks 208 and 222 are exactly the same, changing parameters of DL network 222 results in changing the parameters of the DL network 208 as well. It should be noted that if instead of generating images, the DL networks 208 and 222 generated some kind of reconstructed k-space data of the respective raw image data 204 and perturbed input training data 220 then the loss image 232 would also be reconstructed k-space data of the loss image 232 instead of the image itself.

Figure 4:
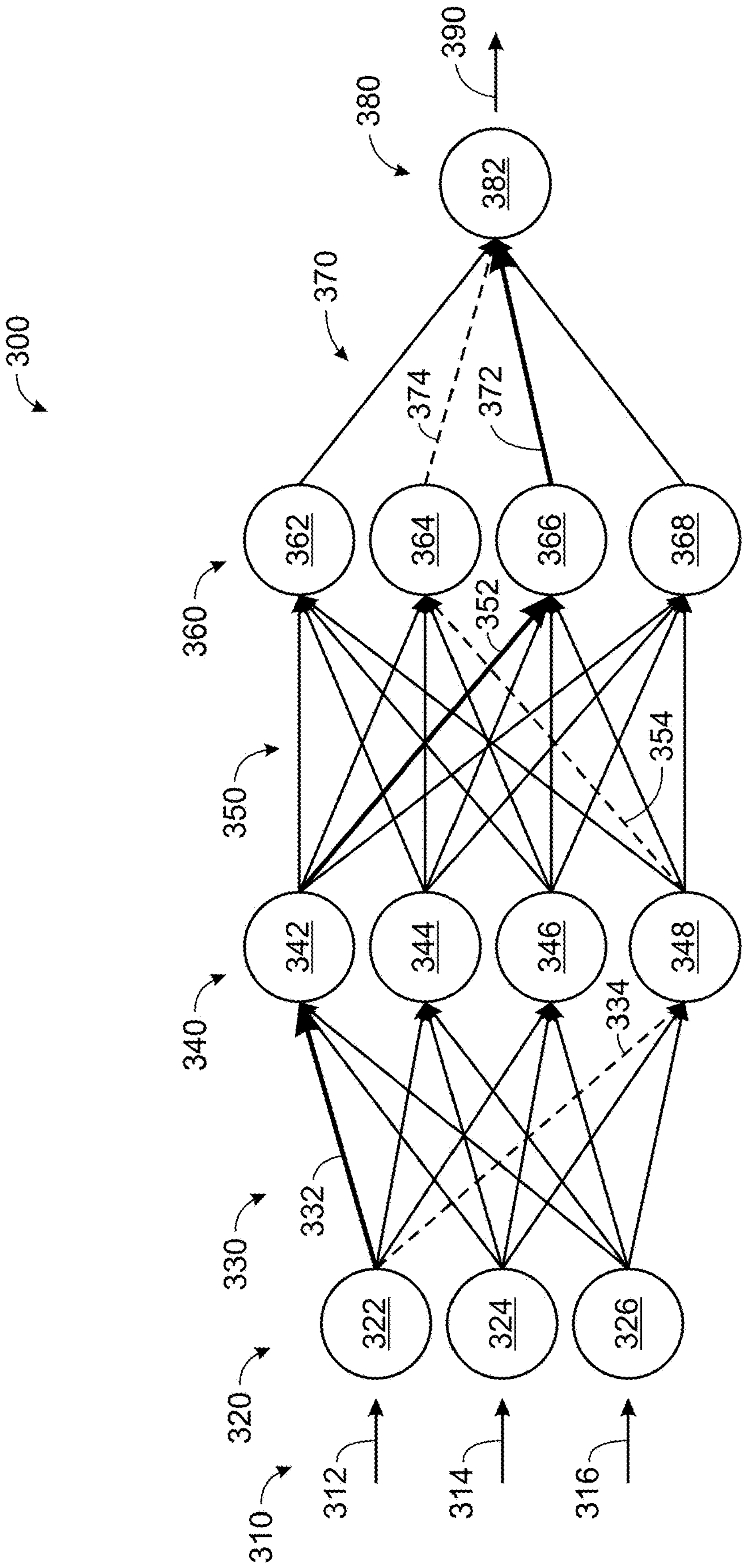
FIG. 4 is a schematic diagram of an example DL network that may be used in the medical image processing system of FIG. 2A in accordance with an embodiment of the present technique.

FIG. 4 is a representation of an example DL network model 300 that may be used as the DL network model in any of the previous embodiments. The example DL network model 300 includes layers 320, 340, 360, and 380. The layers 320 and 340 are connected with neural connections 330. The layers 340 and 360 are connected with neural connections 350. The layers 360 and 380 are connected with neural connections 370. Data flows forward via inputs 312, 314, 316 from the input layer 320 to the output layer 380 and to an output 390. The inputs 312, 314, 316 may be raw image data 204, a perturbation signal 214, sensitivity maps 212 etc.

The layer 320 is an input layer that, in the example of FIG. 4, includes a plurality of nodes 322, 324, 326. The layers 340 and 360 are hidden layers and include, in the example of FIG. 4, nodes 342, 344, 346, 348, 362, 364, 366, 368. The DL network model 300 may include more or less hidden layers 340 and 360 than shown. The layer 380 is an output layer and includes, in the example of FIG. 4 a node 382 with an output 390. Each input 312-316 corresponds to a node 322-326 of the input layer 320, and each node 322-326 of the input layer 320 has a connection 330 to each node 342-348 of the hidden layer 340. Each node 342-348 of the hidden layer 340 has a connection 350 to each node 362-368 of the hidden layer 360. Each node 362-368 of the hidden layer 360 has a connection 370 to the output layer 380. The output layer 380 has an output 390 to provide an output from the example DL network model 300.

Of connections 330, 350, and 370 certain example connections 332, 352, 372 may be given added weight while other example connections 334, 354, 374 may be given less weight in the DL network model 300. Input nodes 322-326 are activated through receipt of input data via inputs 312-316, for example. Nodes 342-348 and 362-368 of hidden layers 340 and 360 are activated through the forward flow of data through the network model 300 via the connections 330 and 350, respectively. Node 382 of the output layer 380 is activated after data processed in hidden layers 340 and 360 is sent via connections 370. When the output node 382 of the output layer 380 is activated, the node 382 outputs an appropriate value based on processing accomplished in hidden layers 340 and 360 of the DL network model 300.

In general, the deep learning network is characterized by using one or a plurality of artificial neural network architectures to extract or simulate data of interest. The deep learning network may be implemented using one or a plurality of processing layers (for example, layers 320, 340, 360, and 380), where the configuration and number of the layers allow a deep learning network to process complex information extraction and modeling tasks. Specific parameters (or referred to as "weight" or "bias") of the network are usually estimated through a so-called learning process (or training process). The learned or trained parameters usually result in (or output) a network corresponding to layers of different levels, so that extraction or simulation of different aspects of initial data or the output of a previous layer usually may represent the hierarchical structure or concatenation of layers. Thus, processing may be performed layer by layer. That is, "simple" features may be extracted from input data for an earlier or higher-level layer, and then these simple features are combined into a layer exhibiting features of higher complexity. In practice, each layer (or more specifically, each "neuron" in each layer) may process input data as output data for representation using one or a plurality of linear and/or non-linear transformations (so-called activation functions). The number of the plurality of "neurons" may be constant among the plurality of layers or may vary from layer to layer.

As discussed herein, a training data set having known input values (for example, known MRI images or known k-space data, known perturbation etc.,) may be employed as part of initial training of a deep learning process that solves a specific problem (i.e., high fidelity image). In this manner, a deep learning algorithm may process a known data set or training data set (in an unsupervised or unguided manner in the present embodiment), until a mathematical relationship between initial data and an expected output is identified (e.g., the R function discussed above with respect to equations 5 and 7). Afterwards, the created output is compared with the expected (target) output of the data set, and then a generated difference from the expected output (i.e., loss) is used to iteratively update network parameters (weight and offset) using a loss function (e.g., L equation 8). One such update/learning mechanism uses a stochastic gradient descent method for updating parameters of a DL network. Apparently, those skilled in the art should understand that other methods known in the art may also be utilized.

Figure 5:
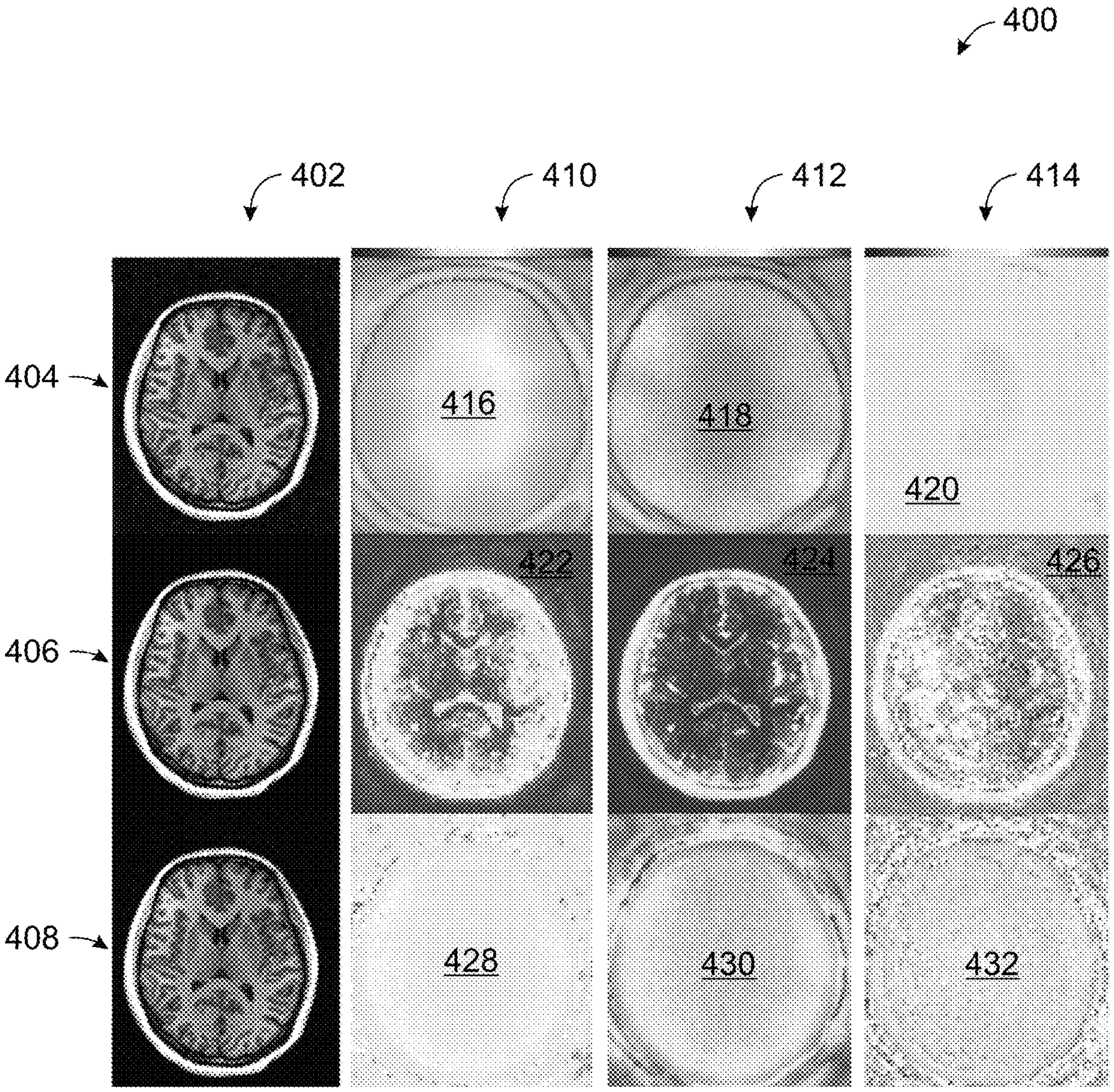
FIG. 5 is a schematic diagram depicting comparative experimental results of various reconstruction techniques in accordance with an embodiment of the present technique.

FIG. 5 shows a schematic diagram 400 depicting comparative experimental results of various reconstruction techniques in accordance with an embodiment of the present technique. Schematic diagram 400 shows comparison of reconstruction techniques used for a 6× accelerated Magnetization-Prepared Rapid Gradient-Echo (MPRAGE) MRI scan. In general, compared to a traditional MPRAGE scan, a 6× accelerated MPRAGE scan is faster and involves acquiring a series of low-resolution images (compared to the traditional MPRAGE scan) of the brain in parallel and then using image processing techniques such as deep learning network model to generate a high-resolution image compared to the acquired low-resolution images.

Specifically, in the schematic diagram 400, a column 402 represents 3 reconstructed MRI images obtained with 3 different reconstruction techniques. For example, image 404 corresponds to a reconstructed image acquired with unregularized iterative sensitivity encoding (SENSE) technique (which is a parallel imaging technique without DL regularization), whereas image 406 corresponds to a reconstructed image acquired with unrolled self-supervised deep learning network technique which utilizes a feedforward network trained using backpropagation and a mean absolute error loss function. Further, image 408 corresponds to a reconstructed image acquired using the deep learning technique presented herein that utilizes perturbed input training data.

Moreover, in the schematic diagram 400, a column 410 represents relative sharpness maps, a column 412 represents relative noise maps and a column 414 represents sharpness-to-noise maps for images 404, 406 and 408. For example, for image 404, the three corresponding maps are 416, 418, 420. Further, for image 406, the three corresponding maps are 422, 424 and 426 whereas for image 408, the three corresponding maps are 428, 430 and 432.

Iterative SENSE technique provides the sharpest image as shown by map 416 but suffers from extreme noise amplification (map 418), yielding a low sharpness-to-noise map 420. The extreme noise amplification of this technique makes it ambiguous whether a pixel in the image is a true signal or is noise. On the other hand, the unrolled self-supervised training technique yields a very low-noise image (map 424) but with relatively poor sharpness (map 422) resulting in a very high sharpness-to-noise map 426. In this technique, the sharpness and noise are anatomy dependent, making low-contrast detectability regionally variable. The proposed deep learning technique presented herein that utilizes perturbed input training data balances sharpness and noise amplification to maximize feature detectability. With this technique, the sharpness (map 428) is generally higher than with the unrolled self-supervised training technique, yet the noise amplification (map 430) is not as high as the iterative SENSE technique. The relative sharpness-to-noise (map 432) is reasonably high and interestingly is not anatomy dependent.

Figure 6:
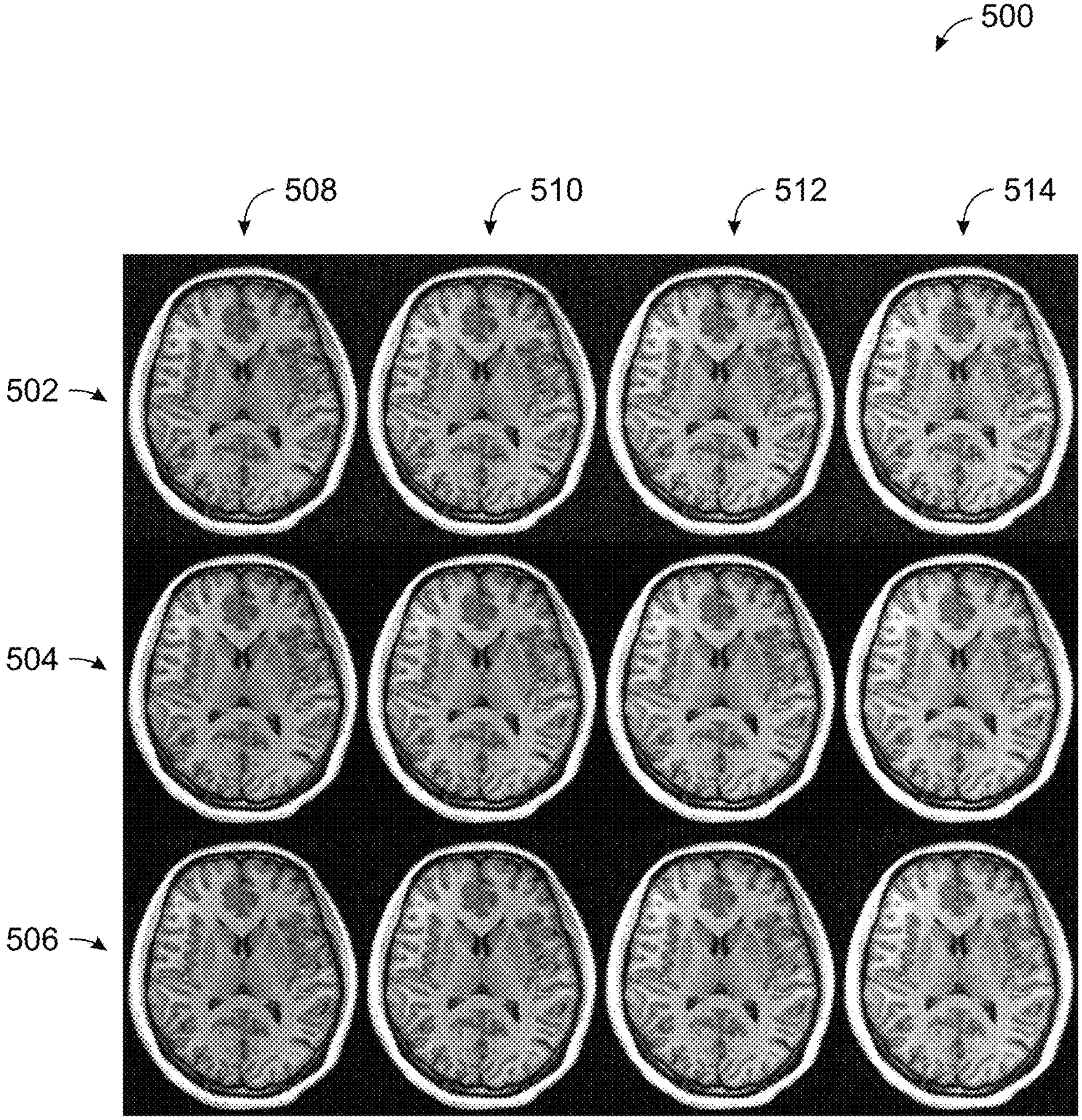
FIG. 6 is a schematic diagram depicting another set of comparative experimental results of various reconstruction techniques in accordance with an embodiment of the present technique.

FIG. 6 shows a schematic diagram 500 depicting another set of comparative experimental results of various reconstruction techniques in accordance with an embodiment of the present technique. Specifically, in schematic diagram 500 rows 502, 504 and 506 corresponds to the three reconstruction techniques 1) iterative SENSE 2) unrolled self-supervised deep learning and 3) proposed deep learning technique with perturbed input training data respectively. Further, the columns 508, 510, 512 and 514 shows reconstructed images obtained with these techniques with 4-, 6-, 8-, and 10-fold prospective acceleration respectively. As can be seen, iterative SENSE technique (row 502 images) appears sharp but is very noisy. Self-supervised technique (row 504 images) yields images that are clean but are not optimized for small feature identification. The proposed DL technique with perturbed input training data (row 506 images) maintains a natural appearance with a balance of noise and subtle features.

One of the advantages of the present technique is that it provides superior image quality especially for optimizing small feature retention using low resolution images. Since the technique utilizes low resolution images, the technique enables higher acceleration rates, translating to faster scans for the patient scan. The faster scan also results in reduced motion artifacts in the final images. Moreover, this technique can be used in conjunction with the other loss functions or DL techniques to further improve the image quality.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A medical imaging system comprising:
- at least one medical imaging device providing image data of a subject; and
- a processing system programmed to:
  - train a deep learning (DL) network using input image training data, wherein the input image training data includes raw image data and at least one perturbation signal, wherein the at least one perturbation signal is not a noise signal, and wherein training with the input image training data enables the DL network to maximize feature preservation even in a presence of noise in inputted image data;
  - use the trained DL network to determine reconstructed image data from the image data of the subject, wherein the reconstructed image data is of higher fidelity than the image data; and
  - generate a medical image of the subject based on the reconstructed image data.

2. The medical imaging system of claim 1, wherein the at least one medical imaging device comprises a magnetic resonance imaging (MRI) system, an X-ray imaging system, a computed tomography (CT) imaging system, or an ultrasound imaging system.

3. The medical imaging system of claim 1, wherein the raw image data is under-sampled image data.

4. The medical imaging system of claim 1, wherein the at least one perturbation signal is a small amplitude signal relative to the raw image data.

5. The medical imaging system of claim 1, wherein the processing system is programmed to update parameters of the DL network based on a loss function, wherein the loss function uses a difference between the at least one perturbation signal and at least one restored perturbation signal as a loss metric.

6. The medical imaging system of claim 5, wherein the loss function is a sum squared error (L2-norms) function or a structural similarity (SSIM) function.

7. The medical imaging system of claim 5, wherein the at least one restored perturbation signal is determined based on a difference between data of a plurality of reconstructed images.

8. The medical imaging system of claim 7, wherein a first reconstructed image of the plurality of reconstructed images is determined by executing the DL network, wherein an input signal to the DL network includes the raw image data.

9. The medical imaging system of claim 7, wherein a second reconstructed image of the plurality of reconstructed images is determined by executing the DL network with a combination of the raw image data, noise data and the at least one perturbation signal as an input signal.

10. The medical imaging system of claim 7, wherein the plurality of reconstructed images is generated by executing the DL network a plurality of times with the raw image data, noise data, a plurality of perturbation signals or combinations thereof.

11. The medical imaging system of claim 1, wherein the reconstructed image data includes a reconstructed image or k-space data thereof.

12. A method for imaging a subject comprising:
- training, at a processing system, a deep learning (DL) network using input image training data, wherein the input image training data includes raw image data and at least one perturbation signal, wherein the at least one perturbation signal is not a noise signal, and wherein training with the input image training data enables the DL network to maximize feature preservation even in a presence of noise in inputted image data;
- acquiring, at the processing system, image data of the subject with a medical imaging device;
- providing, at the processing system, the image data of the subject as an input to the trained DL network;
- using, at the processing system, the DL network to generate a medical image of the subject based on the acquired image data, wherein the medical image is of higher fidelity than the image data.

13. The method of claim 12, wherein the medical imaging device comprises a magnetic resonance imaging (MRI) system, an X-ray imaging system, a computed tomography (CT) imaging system, or an ultrasound imaging system.

14. The method of claim 12, wherein the raw image data is under-sampled image data.

15. The method of claim 12, wherein the at least one perturbation signal is a small amplitude signal relative to the raw image data.

16. The method of claim 12 further comprising updating parameters of the DL network based on a loss function, wherein the loss function uses a difference between the at least one perturbation signal and at least one restored perturbation signal as a loss metric.

17. The method of claim 16, wherein the loss function is a sum squared error (L2-norms) function or a structural similarity (SSIM) function.

18. The method of claim 16, wherein the at least one restored perturbation signal is determined based on a difference between data of a plurality of reconstructed images.

19. The method of claim 18, wherein a first reconstructed image of the plurality of reconstructed images is determined by executing the DL network, wherein an input signal to the DL network includes the raw image data.

20. The method of claim 18, wherein a second reconstructed image of the plurality of reconstructed images is determined by executing the DL network with a combination of the raw image data, noise data and the at least one perturbation signal as an input signal.

21. The method of claim 12, wherein an output of the DL network includes a reconstructed image data and wherein the reconstructed image data includes a reconstructed image or k-space data thereof.

22. A magnetic resonance (MR) system comprising:
- a magnet configured to generate a main magnetic field about at least a portion of a subject arranged in the MRI system;

a gradient coil assembly configured to apply at least one gradient field to the main magnetic field;

a radio frequency (RF) system configured to apply an RF field to the subject and to receive magnetic resonance signals from the subject; and a processing system programmed to:

generate image data of the subject from the MR signals;

use a trained DL network to determine reconstructed image data from the image data of the subject, wherein the reconstructed image data is of higher fidelity than the image data; and generate a medical image of the subject based on the reconstructed image data; and wherein the DL network is trained using input image training data, wherein the input image training data includes raw image data and at least one perturbation signal, wherein the at least one perturbation signal is not a noise signal, and wherein training with the input image training data enables the DL network to maximize feature preservation even in a presence of noise in inputted image data.

* * * * *